(12) United States Patent
Dalton et al.

(10) Patent No.: US 6,451,712 B1
(45) Date of Patent: Sep. 17, 2002

(54) METHOD FOR FORMING A POROUS DIELECTRIC MATERIAL LAYER IN A SEMICONDUCTOR DEVICE AND DEVICE FORMED

(75) Inventors: Timothy Joseph Dalton, Ridgefield, CT (US); Stephen Edward Greco, Lagrangeville, NY (US); Jeffrey Curtis Hedrick, Montvale, NJ (US); Satyanarayana V. Nitta, Fishkill, NY (US); Sampath Purushothaman, Yorktown Heights, NY (US); Kenneth Parker Rodbell, Sandy Hook, CT (US); Robert Rosenberg, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 09/739,935

(22) Filed: Dec. 18, 2000

(51) Int. Cl.$^7$ ................................. H01L 21/31
(52) U.S. Cl. .................... 438/781; 438/780; 438/622
(58) Field of Search ................ 438/622, 623, 438/778–781; 257/758, 759; 521/61, 62, 77, 86

(56) References Cited

U.S. PATENT DOCUMENTS

| | | | |
|---|---|---|---|
| 6,271,273 B1 | * 8/2001 | You et al. | 521/61 |
| 6,342,454 B1 | * 1/2002 | Hawker et al. | 438/780 |
| 6,391,932 B1 | * 5/2002 | Gore et al. | 521/61 |
| 2002/0052125 A1 | * 5/2002 | Shaffer, II et al. | 438/780 |

* cited by examiner

*Primary Examiner*—Steven Loke
*Assistant Examiner*—Douglas W. Owens
(74) *Attorney, Agent, or Firm*—Robert M. Trepp; Randy W. Tung

(57) ABSTRACT

A method for forming a porous dielectric material layer in an electronic structure and the structure formed are disclosed. In the method, a porous dielectric layer in a semiconductor device can be formed by first forming a non-porous dielectric layer, then partially curing, patterning by reactive ion etching, and final curing the non-porous dielectric layer at a higher temperature than the partial curing temperature to transform the non-porous dielectric material into a porous dielectric material, thus achieving a dielectric material that has significantly improved dielectric constant, i.e. smaller than 2.6. The non-porous dielectric material may be formed by embedding a thermally stable dielectric material such as methyl silsesquioxane, hydrogen silsesquioxane, benzocyclobutene or aromatic thermoset polymers with a second phase polymeric material therein such that, at the higher curing temperature, the second phase polymeric material substantially volatilizes to leave voids behind forming a void-filled dielectric material.

43 Claims, 2 Drawing Sheets

METHOD FOR FORMING A POROUS DIELECTRIC MATERIAL LAYER IN A SEMICONDUCTOR DEVICE AND DEVICE FORMED

FIELD OF THE INVENTION

The present invention generally relates to a method for forming a dielectric material layer in an electronic structure and the structure formed and more particularly, relates to a method for forming a porous dielectric material layer in an electronic structure by first forming a non-porous dielectric material layer then partial curing, patterning, and final curing the layer at a higher temperature than that used in the partial curing to transform the non-porous dielectric material into a porous dielectric material, and electronic structure formed by such material.

BACKGROUND OF THE INVENTION

In the recent development of semiconductor devices, the continuing miniaturization of the devices demands the use of electronic materials of more superior properties. For instance, the dielectric material used as an insulating layer in a semiconductor device, must have a lower dielectric constant in order to provide a smaller signal propagation delay. It is therefore important to provide electronic materials that have superior insulating properties, such as a reduced dielectric constant for current and future semiconductor device applications.

One of the solutions in providing a dielectric material layer that has improved insulating property, i.e. a lower dielectric constant, is to use a dielectric material that contains voids. A void-filled, or porous dielectric material has a lower dielectric constant than the fully dense void-free version of the same material. However, problems arise in utilizing porous dielectric materials, i.e. when these materials are first formed in an electronic device and then are subjected to a patterning process by reactive ion etching (RIE). The very nature of the desirable porous structure of these materials subject them to excessive etching when exposed to etch gasses utilized in the reactive ion etching process. One solution proposed to solve this problem is to select low-k dielectric materials that have closed porosity. However, any attempt to slice a closed pore material exposes open pores on a new cut surface. Thus, the pores exposed in such a new cut surface would still be subjected to attack by the etch gas used in the reactive ion etching process for patterning the dielectric material layer.

It is therefore an object of the present invention to provide a method for forming a porous dielectric material layer in an electronic structure that does not have the drawbacks or shortcomings of the conventional methods.

It is another object of the present invention to provide a method for forming a porous dielectric material layer in an electronic structure that is not subjected to attack by reactive ion etching gases during a patterning process.

It is a further object of the present invention to provide a method for forming a porous dielectric material layer in an electronic structure by first forming a non-porous dielectric material layer, patterning the layer in a reactive ion etching process and then forming pores in the dielectric material layer.

It is another further object of the present invention to provide a method for forming a porous dielectric material layer in an electronic structure by first patterning a non-porous dielectric material layer and then forming pores after the patterning process.

It is still another object of the present invention to provide a method for forming a porous dielectric material layer in an electronic structure by first depositing a non-porous dielectric material layer, partially curing the layer at a first low temperature, patterning the non-porous dielectric material layer, and then forming pores and transforming the material layer into a porous structure at a second high curing temperature.

It is yet another object of the present invention to provide a method for forming a porous dielectric material layer in an electronic structure by transforming a dual-phase material into a single-phase, void-filled material at a high curing temperature.

It is still another further object of the present invention to provide an electronic structure that has a layer of porous dielectric material formed therein wherein the layer of porous material has a porosity between about 0.1 vol. % and about 50 vol. %.

It is yet another further object of the present invention to provide an electronic structure that has a layer of porous dielectric material formed therein for electrical insulation wherein the porous dielectric material has a dielectric constant between about 1 and about 3.

SUMMARY OF THE INVENTION

In accordance with the present invention, a method for forming a porous dielectric material layer in an electronic structure and the structure formed are disclosed.

In a preferred embodiment, a method for forming a porous dielectric material layer in an electronic structure can be carried out by the steps of providing a pre-processed electronic substrate, depositing a layer of non-porous dielectric material on top of the pre-process electronic substrate, curing the electronic substrate at a first temperature typically about 250° C., defining and patterning the layer of non-porous dielectric material, and curing the electronic substrate at a second temperature higher than the first temperature (typically about 350° C. to about 450° C.) transforming the non-porous dielectric material into a porous dielectric material.

In the method for forming a porous dielectric material layer in an electronic structure, the non-porous dielectric material is substantially a dual-phase material while the porous dielectric material is substantially a single-phase material. The non-porous dielectric material may be a physical mixture of a thermally labile material and a thermally stable material. The thermally stable material sets into a solid at the first curing temperature, and the thermally labile material decomposes and volatilizes at the second curing temperature. The method may further include the step of forming a mask layer on top of the layer of non-porous dielectric material, or the step of forming the mask layer of at least one material selected from the group consisting of $SiO_2$, $Al_2O_3$, $Si_3N_4$, SiC and SiCOH. The method may further include the step of forming the mask layer to a thickness of not greater than 100 nm. The method may further include the step of providing a pre-processed silicon wafer.

The first temperature used may be between about 100° C. and about 350° C., the second temperature used may be greater than 250° C. and higher than the first temperature. The method may further include the step of photolithographically defining and patterning the layer of non-porous dielectric material, or the step of depositing the non-porous dielectric material by a spin coating method. The porous material formed may have a porosity of between about 0.1 vol. % and about 50 vol. %, or preferably a porosity between about 5 vol. % and about 30 vol. %. The method may further include the step of depositing the layer of non-porous dielectric material to a thickness between about 100 nm and about 1000 nm. The non-porous dielectric material deposited may include methyl silsesquioxane (MSSQ), hydrogen silsesquioxane (HSQ), silica and aromatic thermoset polymers such as the SiLK® Semiconductor Dielectric or Flare® and at least one pore generating labile material or porogen of polymeric nature.

In another preferred embodiment, a method for forming a void-filled dielectric material layer in an electronic structure may be carried out by the operating steps of providing an electronic structure that has devices built on top, depositing a layer of a dual-phase dielectric material consisting of a thermally stable material and a thermally labile material on top of the electronic structure, annealing the electronic structure at a first temperature between the setting temperature of the thermally stable material and the decomposition temperature of the thermally labile material, photolithographically defining and patterning the dual-phase dielectric material, and annealing the electronic structure at a second temperature not less than the decomposition and volatilization temperature of the thermally labile material forming a single-phase, void-filled dielectric material.

In the method for forming a void-filled material layer in an electronic structure, the first temperature may be a temperature between about 100° C. and about 350° C., the second temperature may be greater than about 250° C. and higher than the first temperature.

The thermally stable material sets into a solid at the first annealing temperature, while the thermally labile material volatilizes at the second annealing temperature. The method may further include the step of forming a mask layer on top of the layer of dual-phase dielectric material. The method may further include the step of forming the mask layer of at least one material selected from the group consisting of $SiO_2$, $Al_2O_3$, $Si_3N_4$, SiC and SiCOH. The method may further include the step of forming the mask layer to a thickness of not greater than 100 nm. The first temperature utilized may be between about 100° C. and about 350° C., the second temperature utilized may be greater than 250° C. and higher than the first temperature. The method may further include the step of depositing the layer of dual-phase dielectric material by a spin coating technique to a thickness between about 100 nm and about 1000 nm. The single-phase, void-filled dielectric material may contain voids of between about 0.1 vol. % and about 50 vol. %, and preferably between about 5 vol. % and about 30 vol. %.

The present invention is further directed to an electronic structure that has a layer of porous dielectric material formed therein for electrical insulation which includes a pre-processed electronic substrate, a layer of porous dielectric material that has a porosity between about 0.1 vol. % and about 50 vol. % formed and patterned on the pre-processed electronic substrate, and a conductive metal filling the pattern formed in the layer of porous dielectric material.

In the electronic structure that has a layer of porous dielectric material formed therein for electrical insulation, the porous dielectric material has a dielectric constant of between about 1 and about 3, or preferably between about 1.3 and about 2.6. The conductive metal forms an interconnect between two conductive regions in the electronic structure, the conductive metal may also form an interconnect in a single damascene structure in a semiconductor device, or a dual damascene structure in a semiconductor device. The conductive metal may be copper, aluminum, or other metals such as silver, gold and alloys thereof.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 2:
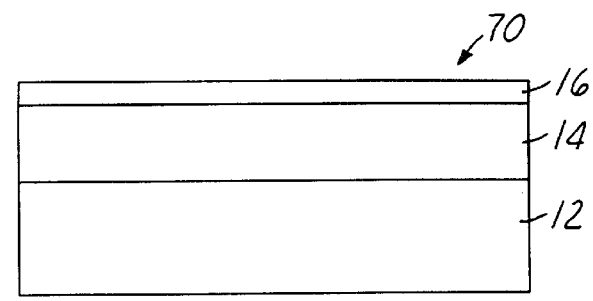
FIG. 2 is an enlarged, cross-sectional view of a present invention semiconductor structure with an ILD layer and a hard mask layer formed on top.

The present invention discloses a method for forming a dielectric material layer in an electronic structure, and more particularly, discloses a method for forming a porous dielectric material layer in an electronic structure by first forming a non-porous dielectric material layer and then partially curing, patterning, and finally curing the layer at a higher temperature than the partial curing temperature to transform the non-porous dielectric material into a porous dielectric material.

The method can be carried out by first providing a pre-processed semiconductor wafer, depositing a layer of non-porous dielectric material on top of the pre-processed semiconductor wafer, curing the semiconductor wafer at a first temperature of not higher than 350° C., defining and patterning the layer of non-porous dielectric material, and curing the semiconductor wafer at a second temperature higher than the first temperature to transform the non-porous dielectric material into a porous dielectric material. In the preferred embodiment method shown below, the non-porous dielectric material is substantially a dual-phased material, while the porous dielectric material is substantially a single-phased material. The non-porous dielectric material may further be a physical mixture of a thermally labile material and a thermally stable material.

The present invention method may further be used to form a void-filled dielectric material layer in an electronic structure by first providing an electronic structure that has devices built on top, depositing a layer of a dual-phase dielectric material consisting of a thermally stable material and a thermally labile material on top of the electronic structure, annealing the electronic structure at a first temperature high enough to set and solidify the thermally stable material, but below the volatilization temperature of the thermally labile material, photolithographically defining and patterning the dual-phase dielectric material, and annealing the electronic structure at a second temperature not less than the volatilization temperature of the thermally labile material forming a single phase, void-filled dielectric material. A suitable range for the first annealing temperature may be between about 100° C. and about 350° C., a suitable temperature for the second annealing step may be greater than the first temperature.

The invention further discloses an electronic structure that has a layer of porous dielectric material formed therein for electrical insulation which includes a pre-processed electronic substrate, a layer of porous dielectric material that has a porosity between about 0.1 vol. % and about 50 vol. % formed and patterned on the pre-processed electronic substrate, and a conductive metal filling the pattern formed in the layer of porous dielectric material. The porous dielectric material may have a dielectric constant between about 1 and about 3, and preferably between about 1.3 and about 2.6. The conductive metal filling the pattern may be copper, aluminum, silver or gold forming a single damascene or a dual damascene interconnect structure.

The present invention method therefore provides a process which eliminates the problem of the porous structure being etched by reactive ion etching gases during a dielectric material patterning process. The present invention method patterns the porous material prior to driving out the second phase polymeric material such that the problem of uncontrolled etch rates can be avoided. By utilizing the present invention novel method, structures can be built with porous low k materials such as Dendriglass or porous SiLK®-type materials. The problem occurred in the conventional method is solved by taking advantage of the properties of the porous material prior to driving out the second phase material, i.e. the pore-forming agent, (also known as porogen) since the film is homogeneous and does not etch away in an uncontrolled manner.

Dendriglass is a chemical composition containing MSSQ (methyl-silsesquioxane) and various amounts of a second phase polymeric material, i.e. a pore-forming agent. Dendriglass can be made into a porous film with a dielectric constant in a range between about 1.3 and about 2.6 depending on the amount of the second phase material added to the film. The word "about" used in this writing indicates a range of values of ±10% from the average value given. The second phase polymeric material, or the poreforming agent, is a material that is usually a long chained polymer which can be decomposed and volatilized and driven from the matrix material, i.e. MSSQ, after the film has been cured in a first curing process.

The present invention method can be carried out by first spin-coating a film onto the surface of a silicon wafer and then hot plate curing the film at 200° C., or at a curing temperature of less than 350° C. The film formed is a mixture of MSSQ with an embedded pore-forming agent throughout the film. The film is usually deposited to a thickness between about 100 nm and about 1000 nm, or preferably between about 300 nm and about 600 nm. A hard mask material is then deposited on top of the silicon wafer. The hard mask material may be formed of $SiO_2$, $Al_2O_3$, $Si_3N_4$, SiC and SiCOH. The hard mask layer is used as an etch stop and pattern replication during photolithography and as a polish stop during chemical mechanical polishing (CMP). The hard mask can be composed of more than one layer of material, however, the total thickness is usually less than 250 nm.

A photoresist layer is then applied on top of the wafer and exposed and cured at a temperature of about 200° C. Next, the hard mask layer is etched in a plasma etching process to remove the hard mask in regions defined by the mask in regions on top of the Dendriglass material. Since the Dendriglass film has only been partially cured at the lower temperature, there is no pore formation for attack by the reactive ion gases. Finally, the completely etched structure is heated to a temperature higher than the first temperature, or preferably higher than 400° C. to 450° C., for a time period long enough to drive out the second phase polymeric material from the Dendriglass resulting in a porous low-k dielectric film. The usual metal deposition process then proceeds with layers of barrier metal/seed Cu/plated Cu. The void content in the final porous dielectric film is between about 0.1 vol. % and about 50 vol. %, or preferably between about 5 vol. % and about 30 vol. % . The final curing temperature should be higher than 250° C., and preferably about 400° C. to 450° C.

The present invention novel method can be carried out without the application of the hard mask, i.e. the non-porous Dendriglass material can be covered with a photoresist layer directly, which is then exposed and cured as in the previously described preferred embodiment. In this alternate embodiment, the Dendriglass film is patterned in a suitable plasma gas and then the photomask layer is removed. The patterned Dendriglass film is then heated to a temperature higher than 400° C. to 450° C. to drive out the second phase polymeric material forming a porous film. Finally, a hard mask film is deposited conformally onto the Dendriglass layer by a technique such as chemical vapor deposition (CVD) which coats both the top surface and the trench and via sidewalls. The hard mask layer can be formed by any of the previously described materials and serves to coat both the top Dendriglass surface required for CMP etch stop, and the via and trench sidewalls required to prevent diffusion pathways into the Dendriglass. A preclean step to preferentially sputter etch any hard mask material at the bottom of the trench can be optionally used prior to depositing the metal layers. The usual metal deposition processes can then proceed which include the deposition of barrier metal/seed Cu/plated Cu.

The second phase polymeric material, or the porogen material, can be a polystyrene, polymethyl methacrylate or a poly-caprolactone based material. The weight average molecular weight of such polymeric materials ranges between about 2,000 and about 140,000. The decomposition temperature of such polymeric materials is about ≧250° C.

Figure 1:
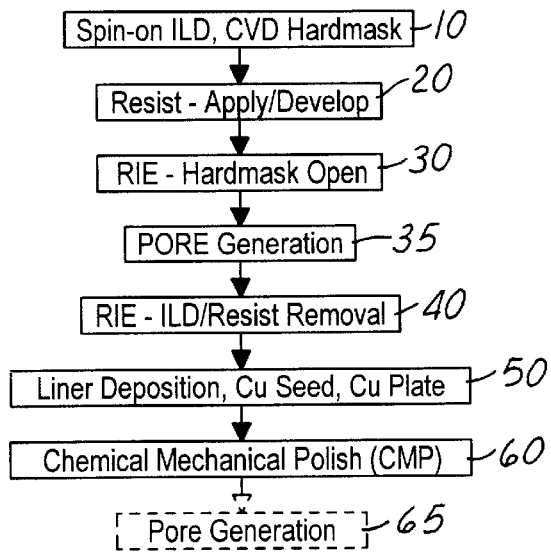
FIG. 1 is a process flow chart for the present invention novel method for forming a porous dielectric material layer in a single damascene interconnect structure.

Referring now to FIG. 1, wherein a process flow chart utilizing the present invention novel method for forming a single-damascene interconnect structure is shown. The processing steps 10~60 can be referenced to FIGS. 2~8, respectively. In the first step of the process, as shown in step 10 of FIG. 2, a semiconductor wafer 70 that has a metal conductive layer 12 deposited on top is first spin-coated with an ILD layer 14 of a silicon oxide material. On top of the ILD layer 14, is then deposited a hard mask layer 16 by a chemical vapor deposition, (CVD) technique. The hard mask can be formed of a suitable material chosen from $SiO_2$, $Al_2O_3$, $Si_3N_4$, SiC, SiCOH or other suitable hard mask material. The purpose of the hard mask layer 16 is to act both as an etch stop and as a pattern replication layer, during CMP and during photolithography, respectively. The hard mask layer 16 may further be formed by more than one layer of material, even though the total thickness should be less than 250 nm. The metal conductive layer 12 may be suitably formed of a high electrical conductivity material such as copper, or aluminum or alloys thereof.

Figure 3:
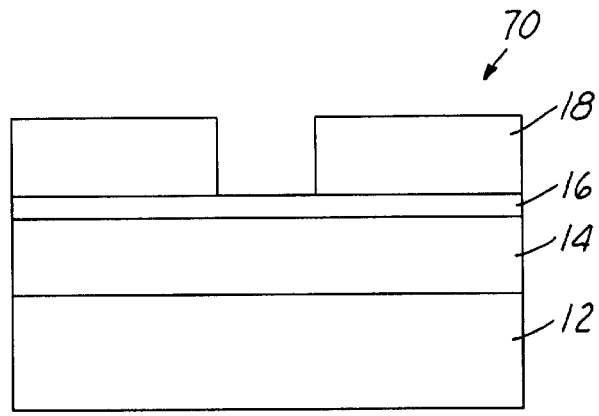
FIG. 3 is an enlarged, cross-sectional view of the present invention structure of FIG. 2 with a photoresist layer formed and patterned on top.
Figure 4:
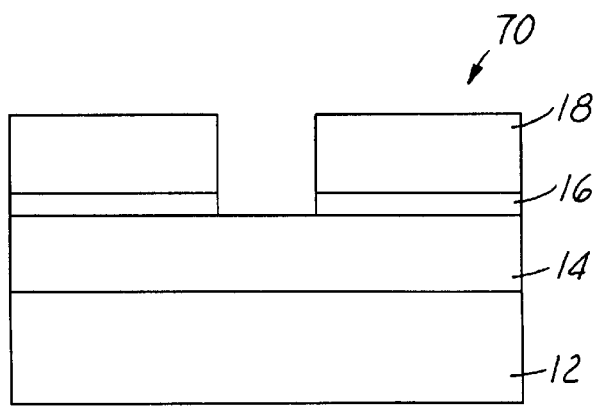
FIG. 4 is an enlarged, cross-sectional view of the present invention structure of FIG. 3 with the hard mask layer patterned.
Figure 5:
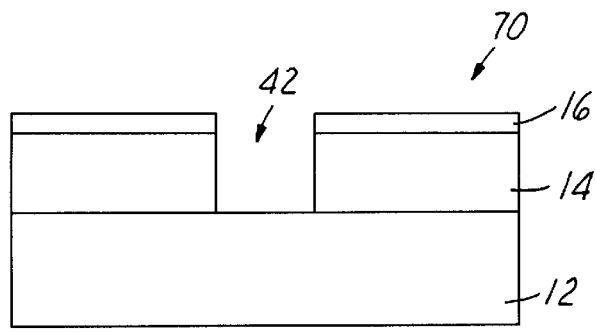
FIG. 5 is an enlarged, cross-sectional view of the present invention semiconductor structure of FIG. 4 with the ILD layer patterned and the photoresist layer removed.

In the next step of the process, shown in step 20 of FIG. 1 and FIG. 3, a photoresist layer 18 is applied to the top of the hard mask layer 16, exposed and then cured at a temperature in the order of 200° C. Hard mask layer 16 is then etched in a plasma etching process to remove the mask in those regions defined by the mask on top of the ILD layer 14. In the conventional method, this is the step where the porosity of the Dendriglass causes its demise, since the reactive gases used in etching the hard mask also attack the Dendriglass® and thus leaving behind a glass material with a high dielectric constant, $k \geq 4.0$. The etching step for the hard mask is shown as Step 30 in FIG. 1 and in FIG. 4.

The non-porous ILD layer 14 is then removed in regions defined in the mask by using a suitable plasma etching method. This is shown in Step 40 of FIG. 1 and in FIG. 5. The resist layer 18 is further removed after the etching of the ILD layer 14 for the opening 42. As shown in step 35 of FIGS. 1 and 8, the completely etched structure 70 is then heated to a temperature higher than 250° C., and preferably in the 400° to 450° C. range for a time period long enough to drive out the second phase polymeric material, i.e. the porogen material from the Dendriglass resulting in a porous low-k dielectric film. The conversion of the ILD layer from non-porous to porous is therefore accomplished in step 40, or in FIG. 5.

Figure 6:
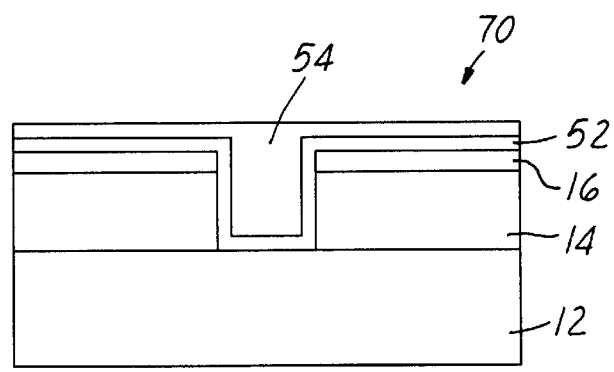
FIG. 6 is an enlarged, cross-sectional view of the present invention semiconductor structure of FIG. 5 with a liner layer deposited and copper plated to fill the via opening.
Figure 7:
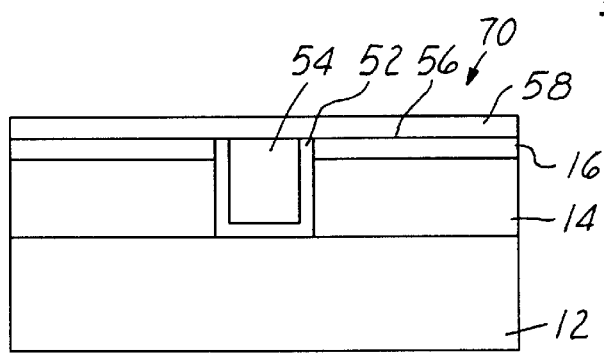
FIG. 7 is an enlarged, cross-sectional view of the present invention semiconductor structure of FIG. 6 with the copper layer planarized and a cap layer deposited on top.
Figure 8:
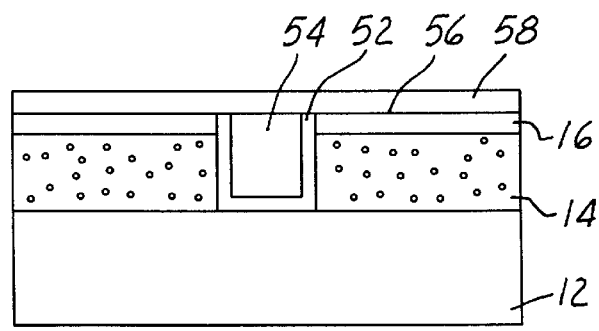
FIG. 8 is an enlarged, cross-sectional view of the present invention semiconductor structure of FIG. 7 after a high temperature anneal to convert the ILD to a porous material.

In the next step of the process, i.e. step 50 shown in FIG. 1 and in FIG. 6, a liner material deposition is first conducted to form a liner layer 52 on top of the hard mask layer 16. The liner layer 52 may be deposited of a material such as TaN, TiN, Ti, Ta, or various combinations for achieving adhesion and diffusion barrier properties. On top of the liner layer 52, is normally deposited a copper seed layer, (not shown) by sputtering to facilitate the subsequent electroplating of copper in filling the via opening 72. After the via opening 52 is filled with copper 54, the electronic structure 70 is planarized by a chemical mechanical polishing method to achieve a planar surface 56 on top of the copper via 54. The porogen may be driven out at this point if desired, as shown in step 65 of FIG. 1. A cap layer 58 of an insulating material such as silicon carbide or silicon nitride is then deposited on top to prevent diffusion and to protect the electronic device 70 from mechanical abrasion or other damages.

The present invention novel method for forming a porous dielectric material layer can further be used to form a dual damascene interconnect in a semiconductor structure. The process for forming the dual damascene interconnect in a semiconductor structure can be carried out by incorporating a hard mask layer on top of a non-porous dielectric layer and then, either removing the hard mask layer prior to volatilizing a pore-forming agent or leaving the hard mask layer in the semiconductor structure when the hard mask utilized is permeable to the pore-forming agent.

For instance, in the first method of forming a dual damascene interconnect with a non-permeable hard mask layer, after a layer of a non-porous dielectric material that contains a pore-forming agent is deposited on top of a pre-processed semiconductor structure, a hard mask layer is formed on top of the non-porous dielectric material. A cavity for a dual damascene interconnect in the non-porous dielectric material is then formed, and filled with an electrically conductive metal to form the via and line for the dual damascene interconnect. The hard mask layer is then removed by an etching process, of either dry or wet etching, prior to a curing process conducted at a temperature sufficiently high, i.e. higher than 250° C., as to volatilize the pore-forming agent from the non-porous dielectric material, thus forming a porous dielectric material for the dual damascene interconnect.

Alternatively, when a hard mask layer is formed which is permeable to the pore-forming agent contained in the non-porous dielectric material, the hard mask layer may be left inside the semiconductor structure during the curing process conducted at high temperature since the pore-forming agent volatilizes and escapes through the permeable hard mask layer. After the formation of the porous dielectric material layer, the semiconductor structure may be planarized and an insulating material layer, i.e. a cap layer, may be deposited on top as a diffusion barrier and protection from abrasion or other physical damages.

A suitable hard mask layer that is permeable to the pore-forming agent may be selected from SiCOH, methyl silsesquioxane (MSSQ), hydrogen silsesquioxane (HSQ) and diamond-like carbon (DLC). A suitable thickness for the permeable hard mask layer should be less than 250 nm.

The present invention method may further be carried out by incorporating the porosity as preformed particulates on the molecular size scale, i.e. to spin-on a solution with insoluble, cross-linked, thermally liable particulates. In this case, the process could be started with a dense two phase material instead of a single phase homogeneous material. The patterning and burnout would be the same as previously stated.

The present invention novel method for forming a porous dielectric layer in a semiconductor structure and the structure formed by the method have been amply described in the above description and in the appended drawings of FIGS. 1~8.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

In addition, the fabrication scheme exemplified for the Dendriglass (porous MSSQ) can be practiced using any other porous dielectric films wherein the remnant material is a higher thermal stability organic material, silica, hydrogen silsesquioxane benzocyclobutene or combinations thereof.

What is claimed is:

1. A method for forming a porous dielectric material layer in an electronic structure comprising the steps of:

providing a pre-processed electronic substrate, depositing a layer of non-porous dielectric material on top of said pre-processed electronic substrate, curing said electronic substrate at a first temperature not higher than 250° C., defining and patterning said layer of non-porous dielectric material, and curing said electronic substrate at a second temperature higher than said first temperature transforming said non-porous dielectric material into a porous dielectric material.

2. A method for forming a porous dielectric material layer in an electronic structure according to claim 1, wherein said non-porous dielectric material being substantially a dual-phase material while said porous dielectric material being substantially a single-phase material.

3. A method for forming a porous dielectric material layer in an electronic structure according to claim 1, wherein said non-porous dielectric material being a physical mixture of a low boiling temperature material and a high boiling temperature material.

4. A method for forming a porous dielectric material layer in an electronic structure according to claim 3, wherein said high boiling temperature material solidifies into a solid at said first curing temperature, said low boiling temperature material volatilizes at said second curing temperature.

5. A method for forming a porous dielectric material layer in an electronic structure according to claim 1 further comprising the step of forming a mask layer on top of said layer of non-porous dielectric material.

6. A method for forming a porous dielectric material layer in an electronic structure according to claim 5 further comprising the step of forming said mask layer of at least one material selected from the group consisting of $SiO_2$, $Al_2O_3$, $Si_3N_4$, SiC and SiCOH.

7. A method for forming a porous dielectric material layer in an electronic structure according to claim 5, further comprising the step of forming said mask layer to a thickness of not greater than 100 nm.

8. A method for forming a porous dielectric material layer in an electronic structure according to claim 1, further comprising the step of providing a pre-processed silicon wafer.

9. A method for forming a porous dielectric material layer in an electronic structure according to claim 1, wherein said first temperature is between about 100° C. and about 250° C., said second temperature is greater than 250° C.

10. A method for forming a porous dielectric material layer in an electronic structure according to claim 1 further comprising the step of photolithographically defining and patterning said layer of non-porous dielectric material.

11. A method for forming a porous dielectric material layer in an electronic structure according to claim 1 further comprising the step of depositing said layer of non-porous dielectric material by a spin coating method.

12. A method for forming a porous dielectric material layer in an electronic structure according to claim 1, wherein said porous material formed having a porosity of between about 0.1 vol. % and about 50 vol. %.

13. A method for forming a porous dielectric material layer in an electronic structure according to claim 1, wherein said porous dielectric material formed preferably having a porosity of between about 5 vol. % and about 30 vol. %.

14. A method for forming a porous dielectric material layer in an electronic structure according to claim 1 further comprising the step of depositing said layer of non-porous dielectric material to a thickness between about 100 nm and about 1000 nm.

15. A method for forming a porous dielectric material layer in an electronic structure according to claim 1, wherein said non-porous dielectric material is a material selected from the group consisting of methyl silsesquioxane, hydrogen silsesquioxane, benzocyclobutene, silica and aromatic thermoset polymers such as SiLK® and Flare® and at least one porogen of polymeric nature.

16. A method for forming a void-filled dielectric material layer in an electronic structure comprising the steps of:
   providing an electronic structure having devices built on top,
   depositing a layer of a dual-phase dielectric material consisting of a high boiling temperature material and a low boiling temperature material on top of said electronic structure,
   annealing said electronic structure at a first temperature between a solidification temperature of said high boiling temperature material and a boiling temperature of said low boiling temperature material,
   photolithographically defining and patterning said dual-phase dielectric material, and
   annealing said electronic structure at a second temperature not less than the boiling temperature of said low boiling temperature material forming a single-phase, void-filled dielectric material.

17. A method for forming a void-filled dielectric material layer in an electronic structure according to claim 16, wherein said first temperature being a temperature between 100° C. and 250° C., said second temperature being greater than 250° C.

18. A method for forming a porous dielectric material layer in an electronic structure according to claim 16, wherein said high boiling temperature material solidifies into a solid at said first annealing temperature, said low boiling temperature material volatilizes at said second annealing temperature.

19. A method for forming a porous dielectric material layer in an electronic structure according to claim 16 further comprising the step of forming a mask layer on top of aid layer of non-porous dielectric material.

20. A method for forming a porous dielectric material layer in an electronic structure according to claim 16 further comprising the step of forming said mask layer of at least one material selected from the group consisting of $SiO_2$, $Al_2O_3$, $Si_3N_4$, SiC and SiCOH.

21. A method for forming a porous dielectric material layer in an electronic structure according to claim 16 further comprising the step of forming said mask layer to a thickness of not greater than 100 nm.

22. A method for forming a porous dielectric material layer in an electronic structure according to claim 16, wherein said first temperature is between about 100° C. and about 250° C., said second temperature is greater than 250° C.

23. A method for forming a porous dielectric material layer in an electronic structure according to claim 16 further comprising the step of depositing said layer of dual-phase dielectric material by a spin coating technique to a thickness between about 100 nm and about 1000 nm.

24. A method for forming a porous dielectric material layer in an electronic structure according to claim 16, wherein said single-phase, void-filled dielectric material containing void of between about 0.1 vol. % and about 50 vol.

25. A method for forming a porous dielectric material layer in an electronic structure according to claim 16 wherein said single phase, void-filled dielectric material containing void of between about 5 vol. % and about 30 vol. %.

26. A method for forming a dual damascene interconnect in a semiconductor structure comprising the steps of:
   providing a pre-processed semiconductor structure;
   depositing a layer of a non-porous dielectric material that contains a pore-forming agent on top of said pre-processed semiconductor structure;
   depositing a mask layer on said non-porous dielectric material;
   forming a cavity for a dual damascene interconnect in said non-porous dielectric material;
   filling said cavity for dual damascene interconnect with an electrically conductive metal;
   removing said mask layer by an etch process;
   curing said semiconductor structure at a temperature sufficiently high so as to volatilize said pore-forming agent from said non-porous dielectric material and forming a porous dielectric material;

planarizing said semiconductor structure; and depositing a dielectric material layer on top of the semiconductor structure.

27. A method for forming a dual damascene interconnect in a semiconductor structure according to claim 26, wherein said non-porous dielectric material is selected from the group consisting of methyl-silsesquioxane (MSSQ), benzocyclobutene, hydrogen silsesquioxane (HSQ), silica and aromatic thermoset polymers such as SiLK® or Flare®.

28. A method for forming a dual damascene interconnect in a semiconductor structure according to claim 26, wherein said pore-forming agent is a polymeric material.

29. A method for forming a dual damascene interconnect in a semiconductor structure according to claim 26, wherein said mask layer is selected from the group consisting of $SiO_2$, $Al_2O_3$, $Si_3N_4$, SiC and SiCOH.

30. A method for forming a dual damascene interconnect in a semiconductor structure according to claim 26, wherein said mask layer is deposited to a thickness of not greater than 100 nm.

31. A method for forming a dual damascene interconnect in a semiconductor structure according to claim 26 further comprising the step of removing said mask layer by a dry etching or a wet etching technique.

32. A method for forming a dual damascene interconnect in a semiconductor structure according to claim 26 further comprising the step of curing said semiconductor structure at a temperature greater than 250° C.

33. A method for forming a dual damascene interconnect in a semiconductor structure according to claim 26 further comprising the step of depositing said layer of non-porous dielectric material that contains a pore-forming agent by a spin coating technique to a thickness between about 100 nm and about 1,000 nm.

34. A method for forming a dual damascene interconnect in a semiconductor structure according to claim 26, wherein said porous dielectric material formed has a porosity between about 0.1 vol. % and about 50 vol. %.

35. A method for forming a dual damascene interconnect in a semiconductor structure comprising the steps of:

providing a pre-processed semiconductor structure;

depositing a layer of a non-porous dielectric material that contains a pore-forming agent on top of said pre-processed semiconductor structure;

depositing a mask layer on said non-porous dielectric material, said mask layer being permeable to said pore-forming agent;

forming a cavity for a dual damascene interconnect in said non-porous dielectric material;

filling said cavity for dual damascene interconnect with an electrically conductive metal;

planarizing said semiconductor structure;

curing said semiconductor structure at a temperature sufficiently high such that said pore-forming agent from said non-porous dielectric material escapes through said mask layer forming a porous dielectric material; and depositing a dielectric material layer on top of the semiconductor structure.

36. A method for forming a dual damascene interconnect in a semiconductor structure according to claim 35 further comprising the step of depositing a non-porous dielectric material that contains a pore-forming agent by a spin coating technique.

37. A method for forming a dual damascene interconnect in a semiconductor structure according to claim 35 further comprising the step of depositing a non-porous dielectric material that contains a pore-forming agent to a thickness between about 100 nm and about 1,000 nm.

38. A method for forming a dual damascene interconnect in a semiconductor structure according to claim 35, wherein said non-porous dielectric material is selected from the group consisting of methyl-silsesquioxane (MSSQ), benzocyclobutene, hydrogen silsesquioxane (HSQ), silica and aromatic thermoset polymers such as SiLK® and Flare®.

39. A method for forming a dual damascene interconnect in a semiconductor structure according to claim 35, wherein said pore-forming agent is a material of polymeric nature that volatilizes at a temperature higher than 250° C.

40. A method for forming a dual damascene interconnect in a semiconductor structure according to claim 35, wherein said mask layer being permeable to said pore-forming agent is selected from the group consisting of SiCOH, methyl silsesquioxane (MSSQ), hydrogen silsesquioxane (HSQ) and diamond-like carbon (DLC).

41. A method for forming a dual damascene interconnect in a semiconductor structure according to claim 35 further comprising the step of depositing said mask layer to a thickness of less than 100 nm.

42. A method for forming a dual damascene interconnect in a semiconductor structure according to claim 35 further comprising the step of curing said semiconductor structure at a temperature greater than 250° C.

43. A method for forming a dual damascene interconnect in a semiconductor structure according to claim 35 further comprising the step of forming said porous dielectric material that contains between about 0.1 vol. % and about 50 vol. % porosity.

* * * * *